United States Patent
Smith

(10) Patent No.: US 10,607,875 B2
(45) Date of Patent: Mar. 31, 2020

(54) AUTOMATED ELECTROSTATIC BONDING/DE-BONDING APPARATUS

(71) Applicant: Eryn Smith, Pleasanton, CA (US)

(72) Inventor: Eryn Smith, Pleasanton, CA (US)

( * ) Notice: Subject to any disclaimer, the term of this patent is extended or adjusted under 35 U.S.C. 154(b) by 317 days.

(21) Appl. No.: 15/878,153

(22) Filed: Jan. 23, 2018

(65) Prior Publication Data

US 2018/0151403 A1 May 31, 2018

Related U.S. Application Data

(60) Continuation-in-part of application No. 15/695,835, filed on Sep. 5, 2017, now Pat. No. 9,984,913, which is a division of application No. 14/538,183, filed on Nov. 11, 2014, now Pat. No. 9,754,809, application No. 15/878,153, which is a continuation-in-part of application No. 15/259,959, filed on Sep. 8, 2016, now Pat. No. 10,236,202, which is a continuation-in-part of application No. 14/717,839, filed on May 20, 2015, now Pat. No. 9,966,294.

(60) Provisional application No. 61/902,591, filed on Nov. 11, 2013, provisional application No. 62/001,503, filed on May 21, 2014.

(51) Int. Cl.
| | |
|---|---|
| *H01T 23/00* | (2006.01) |
| *H01L 21/683* | (2006.01) |
| *H02N 13/00* | (2006.01) |
| *H01L 21/677* | (2006.01) |
| *H01L 21/67* | (2006.01) |
| *H01L 21/687* | (2006.01) |

(52) U.S. Cl.
CPC ...... *H01L 21/6833* (2013.01); *H01L 21/6719* (2013.01); *H01L 21/67092* (2013.01); *H01L 21/67253* (2013.01); *H01L 21/67259* (2013.01); *H01L 21/67748* (2013.01); *H01L 21/67766* (2013.01); *H01L 21/67775* (2013.01); *H01L 21/67778* (2013.01); *H01L 21/6831* (2013.01); *H01L 21/68785* (2013.01); *H02N 13/00* (2013.01)

(58) Field of Classification Search
None
See application file for complete search history.

(56) References Cited

U.S. PATENT DOCUMENTS 8,043,432 B2 * 10/2011 Dip ................... C23C 16/45508
                                                              118/719
9,754,809 B2    9/2017 Smith
9,831,099 B2 * 11/2017 O'Meara ........... H01L 21/02123

\* cited by examiner

*Primary Examiner* — Stephen W Jackson

(57) ABSTRACT

An automated electrostatic bonding/de-bonding apparatus is used to automate a mating or separating process between a semiconductive wafer and a mobile electrostatic carrier (MESC). The apparatus includes a transfer enclosure, a robot arm, a bonding/de-bonding station, input/output (I/O) ports, I/O cassettes, and a control unit. The I/O cassettes house the different dispensable items that are used during the mating or separating process, such as semiconductive wafers, MESCs, and mated assemblies thereof. The robot arm moves the dispensable items between the I/O cassettes and the bonding/de-bonding station. The transfer enclosure prevents any external physical interference with the movement of the robot arm. The I/O ports integrated into the transfer enclosure allow the robot arm to access the I/O cassettes, which are located outside of the transfer enclosure. The control unit is used to manage the functionalities of the robot arm and the bonding/de-bonding station.

20 Claims, 7 Drawing Sheets

AUTOMATED ELECTROSTATIC BONDING/DE-BONDING APPARATUS

The current application is a continuation-in-part (CIP) application of the U.S. non-provisional patent application Ser. No. 15/695,835 filed on Sep. 5, 2017. The U.S. non-provisional patent application Ser. No. 15/695,835 is a divisional (DIV) application of the U.S. non-provisional application Ser. No. 14/538,183 filed on Nov. 11, 2014. The U.S. non-provisional application Ser. No. 14/538,183 claims a priority to the U.S. provisional patent application Ser. No. 61/902,591 filed on Nov. 11, 2013.

The current application is further a CIP application of the U.S. non-provisional patent application Ser. No. 15/259,959 filed on Sep. 13, 2016. The U.S. non-provisional patent application Ser. No. 15/259,959 is a CIP application of the U.S. non-provisional patent application Ser. No. 14/717,839 filed on May 20, 2015. The U.S. non-provisional patent application Ser. No. 14/717,839 claims a priority to the U.S. provisional patent application 62/001,503 filed on May 21, 2014.

FIELD OF THE INVENTION

The present invention generally relates to an apparatus that automates a mating or separation process between semiconductive wafer and a mobile electrostatic carrier. More specifically, the present invention uses a pick-and-place robot arm to move semiconductive wafers and mobile electrostatic carriers in between retainment cassettes and a bonding/debonding station.

BACKGROUND OF THE INVENTION

A semiconductive wafer is a thin slice of material, such as a silicon crystal, borophosphosilicate glass (BPSG), quartz, etc. or other substrate composition known to the art, which is used in the fabrication of integrated circuits and other micro devices. The wafer serves as the substrate for microelectronic devices built in and over the wafer and undergoes many micro fabrication process steps such as doping or ion implantation, etching, deposition of various materials, and photolithographic patterning. Substrate to mobile electrostatic carrier (MESC) bonding is used in fabrication of semiconductor devices, display devices, such as microelectromechanical systems (MEMS), micro-opto-electromechanical systems (MOEMS), and silicon on insulator (SOI).

MESC technology enables bonding by using electrostatic field lines to capture the target wafer (see U.S. Pat. No. 9,754,809). Based on the tri-polar design of the antenna geometry and manufacturing techniques, the MESC technology can generate very large bonding forces to hold the target wafer. The MESC technology have two additional benefit bonds that form as well: the second benefit is a dipole bond and the third benefit is through a vacuum process, or highly polished surfaces we induce a polar covalent bonding structure. This is achieved by careful selection of final topcoat of the carrier to target substrate, the electronegativity interactions need to be chosen.

The present invention is a tool with automated handling (robot or other machine) that precision places both the target wafer and MESC in a specifically designed wafer charging/bonding station, then return the mated pair to an output station for use in the semi-fabrication production line. The present invention also does the reverse process of de-bonding the mated pair back to individual target substrate and MESC. The MESC is durable and reusable.

SUMMARY OF INVENTION

The present invention is an apparatus or machine that is designed specifically to handle thin, mismatched shapes, sizes, and ultrathin substrates for use in the semiconductor or display industry. Mating the thin substrate (target wafer) to a mobile electrostatic wafer carrier (MESC) for the purpose of adding rigidity to allow safe handling of aforementioned target wafer. The use of thin and ultrathin wafers has become more prevalent in recent years as has the requirement to run smaller substrates on larger carriers to utilize the latest high technology process systems; the thin material offers many performance benefits vs. full thickness wafers. The form factor is not specific and could be square, rectangles, or other shapes depending on the final application. These thin substrates do offer many challenges in processing and handling though. Therefore, an objective of the present invention mates the target wafer or substrate to the MESC in a full automated fashion.

DETAILED DESCRIPTION OF THE INVENTION

Figure 1:
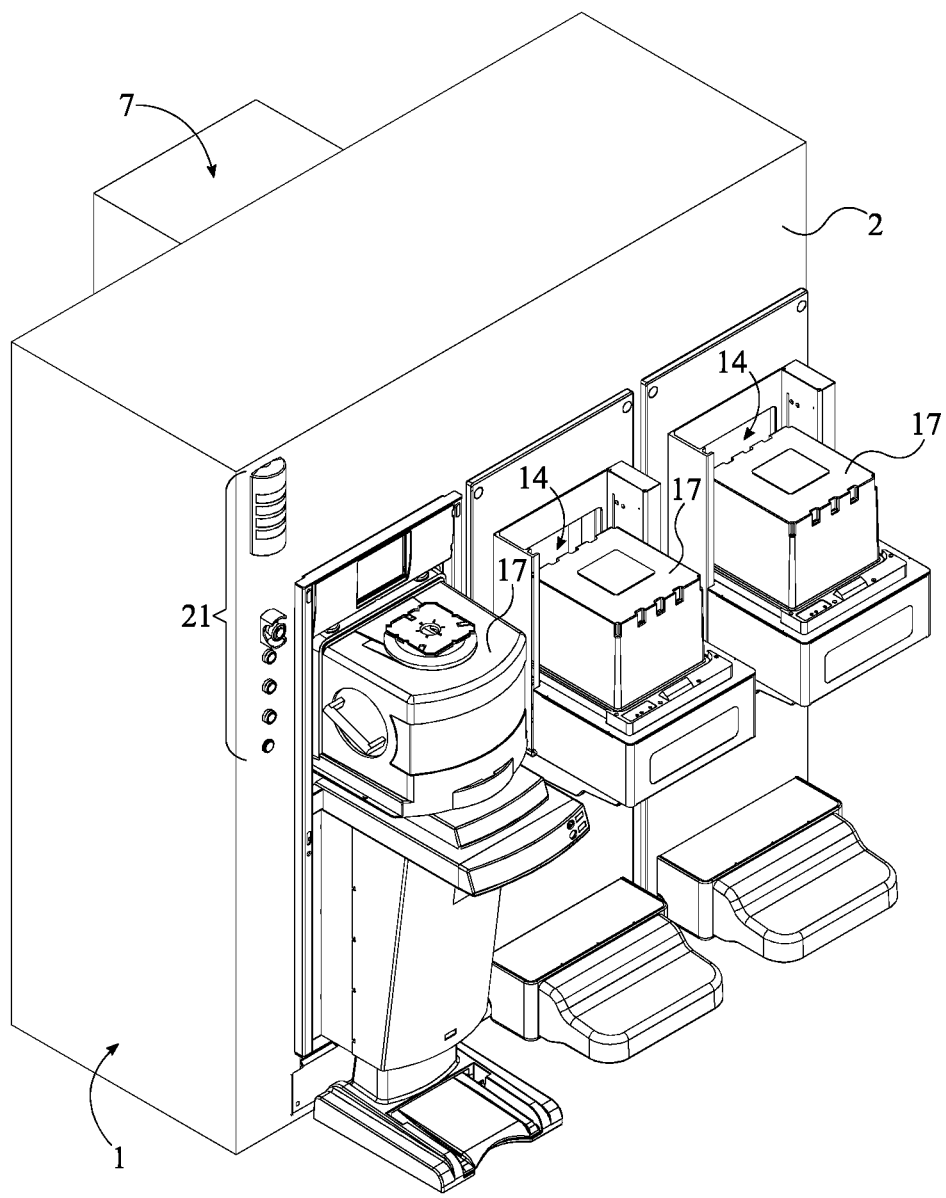
FIG. 1 is a front perspective of the present invention.
Figure 2:
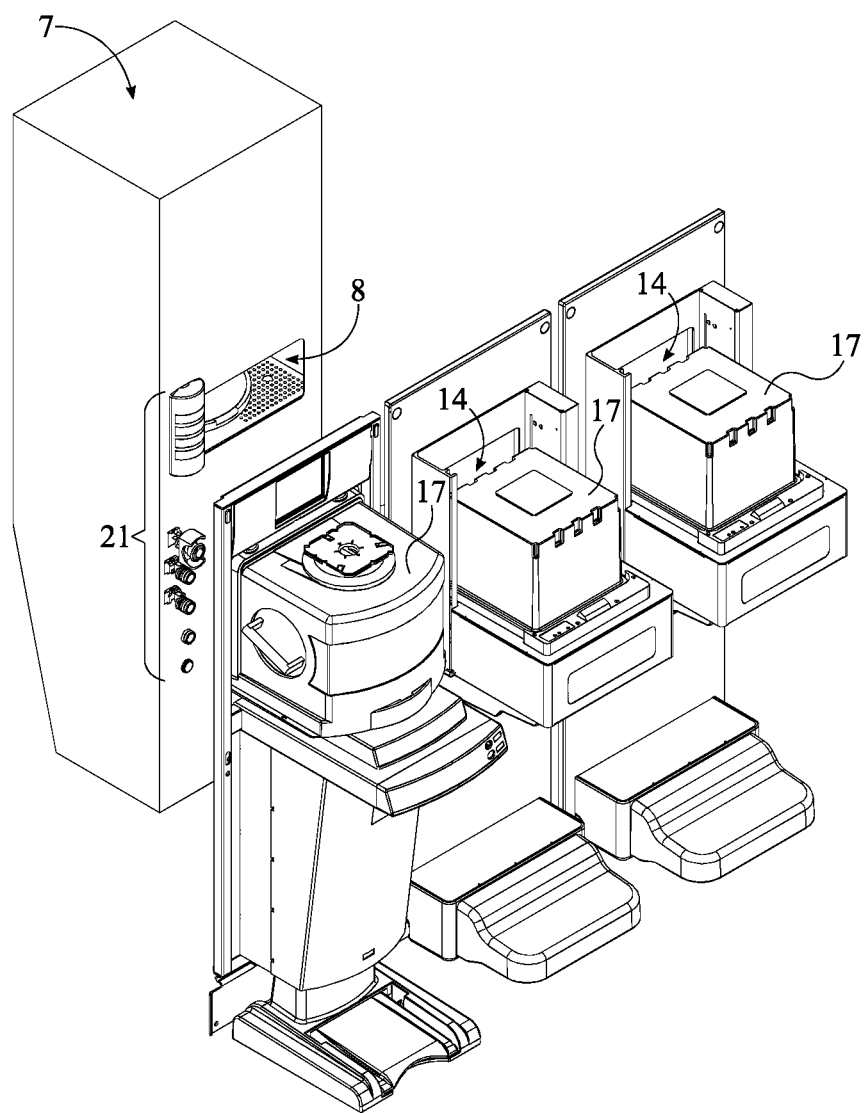
FIG. 2 is a front perspective of the present invention without the transfer enclosure.

All illustrations of the drawings are for the purpose of describing selected versions of the present invention and are not intended to limit the scope of the present invention.

The present invention is an automated electrostatic bonding/de-bonding apparatus that is used to automate a mating or separating process between a semiconductive wafer and a mobile electrostatic carrier. As can be seen in FIG. 1 through 4, the preferred embodiment of the present invention comprises a transfer enclosure 1, a pick-and-place robot arm 4, a bonding/de-bonding station 7, a plurality of input/output (I/O) ports 14, a plurality of I/O cassettes 17, and a control unit 21. The plurality of I/O cassettes 17 is used to separately retain a stack of semiconductive wafers, a stack of mobile electrostatic carriers, a stack of bonded wafer-carrier assemblies, and/or any other kind of dispensable semiconductor-related items. The pick-and-place robot arm 4 is used to transport those dispensable items between the plurality of I/O cassettes 17 and the bonding/de-bonding station 7. Moreover, the bonding/de-bonding station 7 is used to provide enough electrostatic charge to bond those dispensable items together or is used to release the electrostatic charge between two bonded dispensable items so that the two bonded dispensable items can be separated from each other. The transfer enclosure 1 prevents any external physical interference with the movement of the pick-and-place robot arm 4. The plurality of I/O ports 14 allows the pick-and-place robot arm 2 to access the plurality of I/O cassettes 17 and the bonding/de-bonding station 7 from inside the transfer enclosure 1. The control unit 21 is used to coordinate and manage the different functionalities of the pick-and-place robot arm 4, the bonding/de-bonding station 7, and any other electronic components of the present invention.

The general configuration of the aforementioned components allows the present invention to efficiently and effectively automate the mating or separating process between a semiconductive wafer to a mobile electrostatic carrier. Each of the plurality of I/O ports 14 is integrated into the transfer enclosure 1, which provides the pick-and-place robot arm 4 with designated areas on the transfer enclosure 1 to access the plurality of I/O cassettes 17. Thus, each of the plurality of I/O cassettes 17 needs to be engaged to a selected port from the plurality of I/O ports 14, which securely docks the plurality of I/O cassettes 17 at designated areas on the transfer enclosure 1. In addition, an entrance 8 of the bonding/de-bonding station 7 traverses into the transfer enclosure 1, which similarly provides the pick-and-place robot arm 4 with a designated area on the transfer enclosure 1 to access the bonding/de-bonding station 7. The plurality of I/O ports 14 and the bonding/de-bonding station 7 are distributed about the transfer enclosure 1 so that the pick-and-place robot arm 4 does not need to navigate a set of clustered access points about the transfer enclosure 1. Moreover, the pick-and-place robot arm 4 is operatively mounted within the transfer enclosure 1, wherein the pick-and-place robot arm 4 is able to readily transport items amongst the plurality of I/O cassettes 17 and the bonding/de-bonding station 7. The pick-and-place robot arm 4 and the bonding/de-bonding station 7 is electronically connected to the control unit 21, which allows the control unit 21 to readily maneuver the pick-and-place robot arm 4 and to readily activate the bonding/de-bonding station 7 for either the mating process or the separation process.

Figure 5:
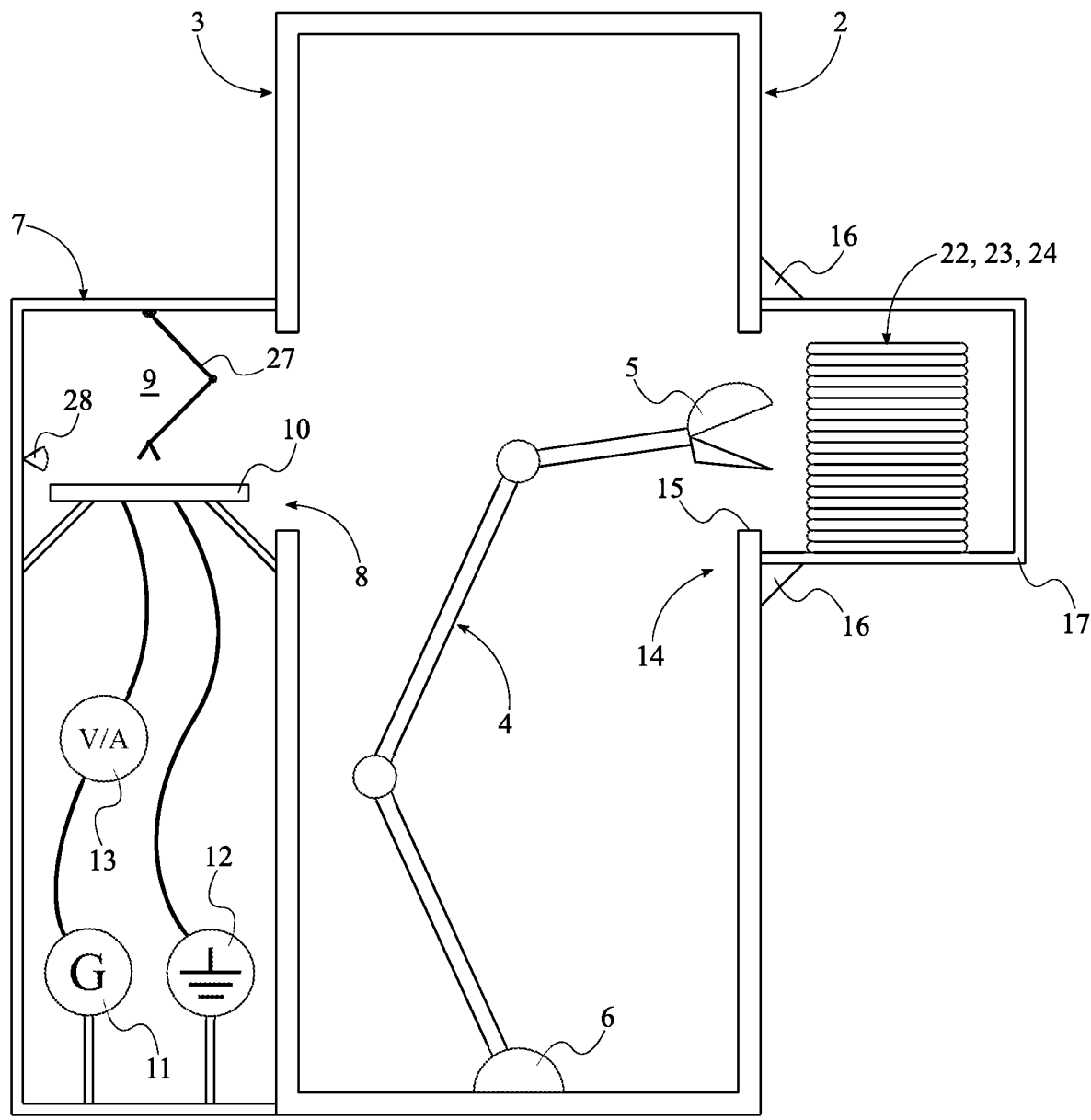
FIG. 5 is a side schematic view of the present invention.
Figure 6:
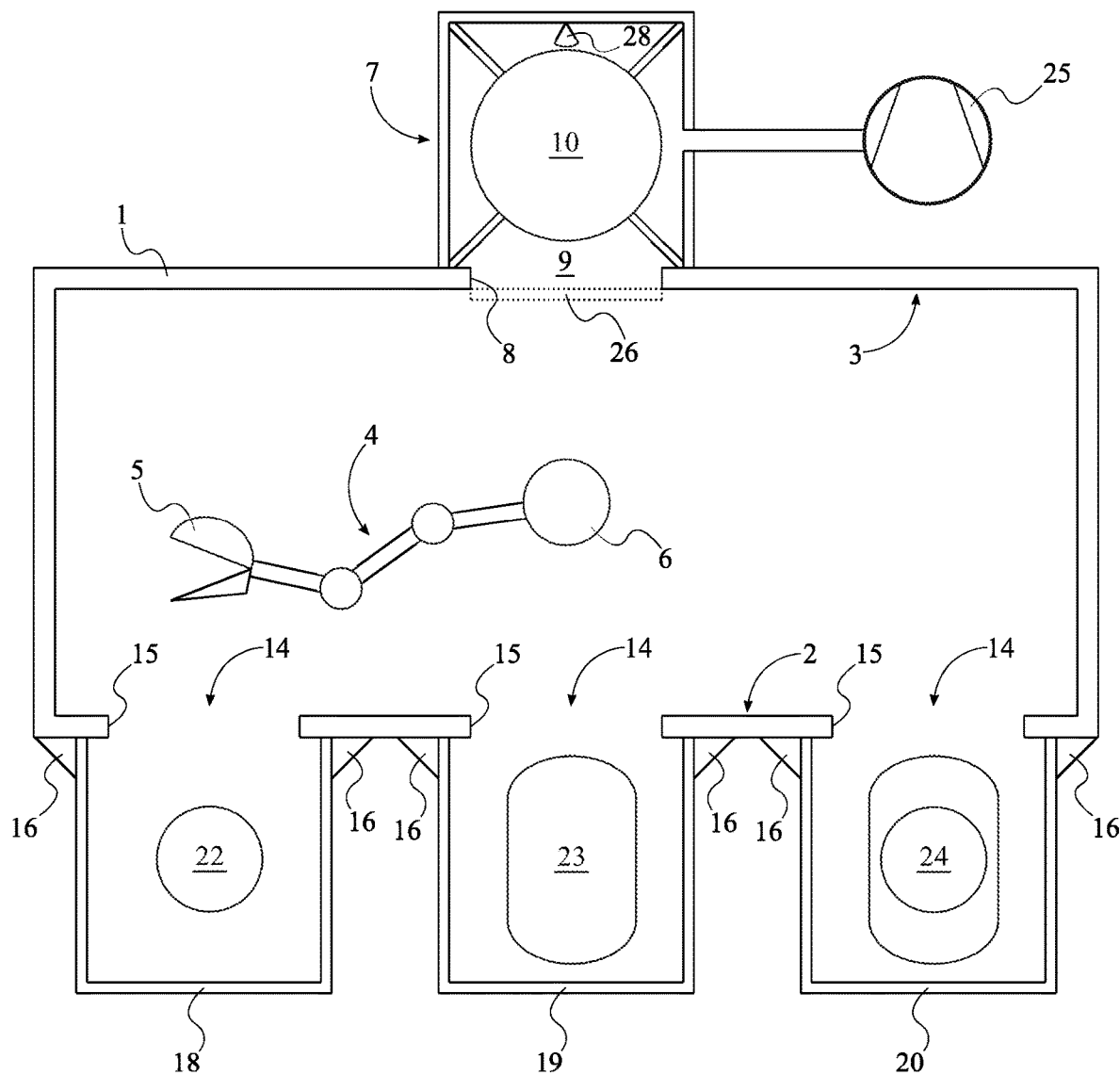
FIG. 6 is a top schematic view of the present invention.

The present invention designates different cassettes within the plurality of I/O cassettes 17 to different items that are needed to complete the mating or separating process between a semiconductive wafer and a mobile electrostatic carrier. Thus, the plurality of I/O cassettes 17 may comprise a first I/O cassette 18, a second I/O cassette 19, and a third I/O cassette 20, which are shown in FIGS. 5 and 6. The first I/O cassette 18 is used to house a stack of semiconductive wafers 22. The pick-and-place robot arm 4 is configured with the necessary mechanical parts and joints to grasp a single wafer from the stack of semiconductive wafers 22 out of the first I/O cassette 18. The pick-and-place robot arm 4 is also configured with the necessary mechanical parts and joints to insert a single wafer into the stack of semiconductive wafers 22 within the first I/O cassette 18. Similarly, the second I/O cassette 19 is used to house a stack of mobile electrostatic carriers 23. The pick-and-place robot arm 4 is further configured with the necessary mechanical parts and joints to grasp a single carrier from the stack of mobile electrostatic carriers 23 out of the second I/O cassette 19. The pick-and-place robot arm 4 is also configured with the necessary mechanical parts and joints to insert a single carrier into the stack of mobile electrostatic carriers 23 within the second I/O cassette 19. Likewise, the third I/O cassette 20 is used to house a stack of bonded wafer-carrier assemblies 24. The pick-and-place robot arm 4 is further configured with the necessary mechanical parts and joints to grasp a single assembly from the stack of bonded wafer-carrier assemblies 24 out of the third I/O cassette 20. The pick-and-place robot arm 4 is also configured with the necessary mechanical parts and joints to insert a single assembly into the stack of bonded wafer-carrier assemblies 24 within the third I/O cassette 20.

As can be seen FIG. 6, the configuration of the pick-and-place robot arm 4 is used to transport semiconductive wafers, mobile electrostatic carriers, and bonded wafer-carrier assemblies through the present invention during the mating process. The mating process begins by grasping a single carrier from the second I/O cassette 19 with the pick-and-place robot arm 4 and placing the single carrier within the bonding/de-bonding station 7. The mating process continues by grasping a single wafer from the first I/O cassette 18 and placing the single wafer onto the single carrier within the bonding/de-bonding station 7. The bonding/de-bonding station 7 then electrostatically bonds the single wafer onto the single carrier, which results in a single assembly. The mating process concludes by grasping the single assembly from the bonding/de-bonding station 7 and inserting the single assembly into the third I/O cassette 20.

As can be seen FIG. 6, the configuration of the pick-and-place robot arm 4 is also used to transport semiconductive wafers, mobile electrostatic carriers, and bonded wafer-carrier assemblies through the present invention during the separating process. The separating process begins by grasping a single assembly from the third I/O cassette 20 with the pick-and-place robot arm 4 and placing the single assembly within the bonding/de-bonding station 7. The bonding/de-bonding station 7 then electrostatically de-bonds the single assembly into a single wafer and a single carrier. The separating process continues by grasping the single wafer from the bonding/de-bonding station 7 and inserting the single wafer into the first I/O cassette 18. The separating process concludes by grasping the single carrier from the bonding/de-bonding station 7 and inserting the single carrier into the second I/O cassette 19.

Figure 3:
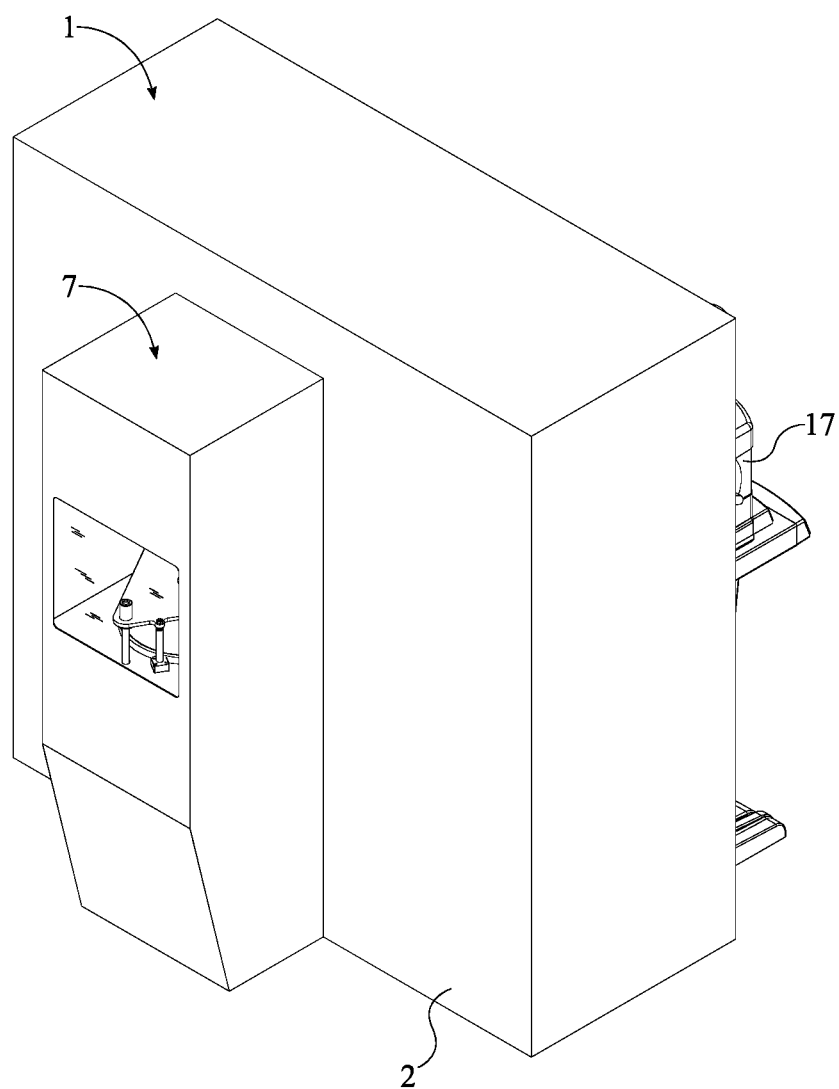
FIG. 3 is a rear perspective of the present invention.
Figure 4:
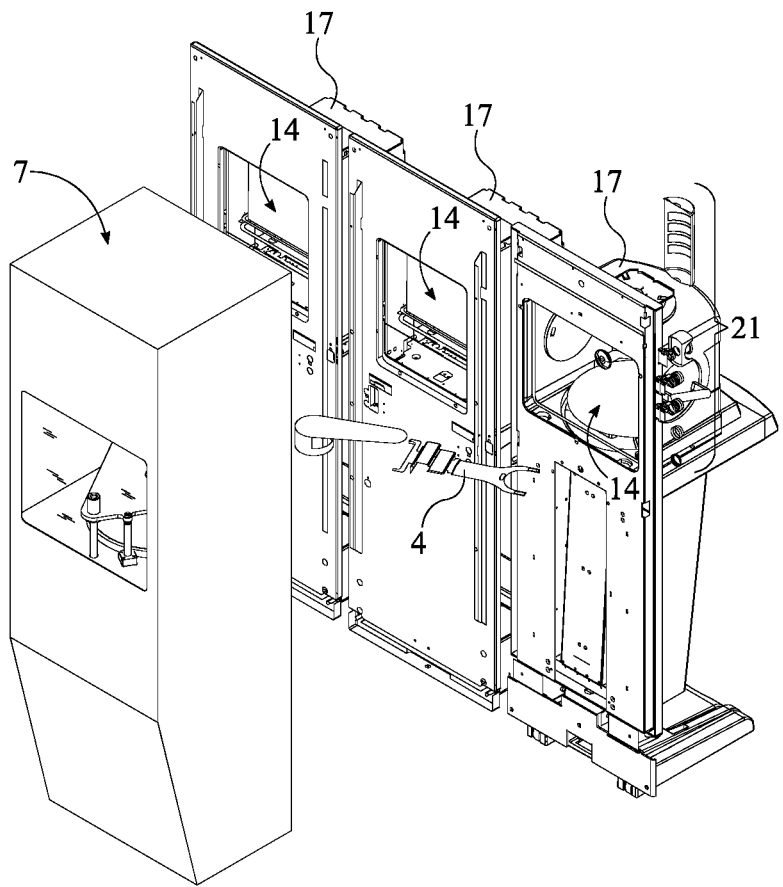
FIG. 4 is a rear perspective of the present invention without the transfer enclosure.

The transfer enclosure 1 is shaped to allow the pick-and-place robot arm 4 to move between the plurality of I/O ports 14 and the bonding/de-bonding station 7. As can be seen in FIGS. 1 and 3, the transfer enclosure 1 may comprise a first face 2 and a second face 3, both of which are positioned parallel to each other and are positioned opposite to each other about the transfer enclosure 1. Each of plurality of I/O ports 14 are integrated into the first face 2, and the entrance 8 of the bonding/de-bonding station 7 traverses into the second face 3, which allows the pick-and-place robot arm 4 to efficiently transport items in one motion from the first face 2 to the second face 3 and vice versa.

The plurality of I/O ports 14 allows the pick-and-place robot arm 4 to access the plurality of I/O cassettes 17, which are located outside of the transfer enclosure 1. Each of the plurality of I/O ports 14 may comprise an access hole 15 and a lock-and-release mechanism 16, which are shown in FIGS. 5 and 6. The access hole 15 traverses into the transfer enclosure 1 so that the pick-and-place robot arm 4 can move outside of the confines of the transfer enclosure 1 and into one of the plurality of I/O cassettes 17. The lock-and-release mechanism 16 is externally mounted to the transfer enclosure 1, which allows each of the plurality of I/O cassettes 17 to be detachably attached to the selected port by the lock-and-release mechanism 16. For example, an empty third I/O cassette 20 can be attached to the selected port by engaging the lock-and-release mechanism 16 at the beginning of a series of mating processes. When the third I/O cassette 20 is filled with the stack of bonded wafer-carrier assemblies 24 at the end of the series of mating processes, the third I/O cassette 20 can be detached from the selected port by disengaging the lock-and-release mechanism 16. Also for example, a third I/O cassette 20 filled with the stack of bonded wafer-carrier assemblies 24 can be attached to the selected port by engaging the lock-and-release mechanism 16 at the beginning of a series of separating processes. When the stack of bonded wafer-carrier assemblies 24 is emptied from the third I/O cassette 20 at the end of the series of separating processes, the third I/O cassette 20 can be detached from the selected port by disengaging the lock-and-release mechanism 16. In addition, the plurality of I/O ports 14 can be configured to accommodate different size semiconductive wafers and/or mobile electrostatic carriers.

As can be seen in FIGS. 5 and 6, the pick-and-place robot arm 4 needs to be properly mounted within the transfer enclosure 1 so that the pick-and-place robot arm 4 can perform the necessary motions to transport items between the plurality of I/O cassettes 17 and the bonding/de-bonding station 7. The pick-and-place robot arm 4 may comprise a grasping end 5 and a fixed end 6. The fixed end 6 is pivotably connected within the transfer enclosure 1, offset from the plurality of I/O ports 14 and the entrance 8 of the bonding/de-bonding station 7, which preferably positions the fixed end 6 onto a base of the transfer enclosure 1. This prevents the pivotable connection between the transfer enclosure 1 and the fixed end 6 from interfering with any of the mechanical movements made by the pick-and-place robot arm 4. Moreover, the grasping end 5 is positioned adjacent to the plurality of I/O ports 14 and the entrance 8 of the bonding/de-bonding station 7, so that the grasping end 5 has easy access to the plurality of I/O cassettes 17 and the bonding/de-bonding station 7. This allows the mechanical movements made by the pick-and-place robot arm 4 to guide the grasping end 5 to the desired destination amongst each of the plurality of I/O ports 14 and the bonding/de-bonding station 7.

Figure 7:
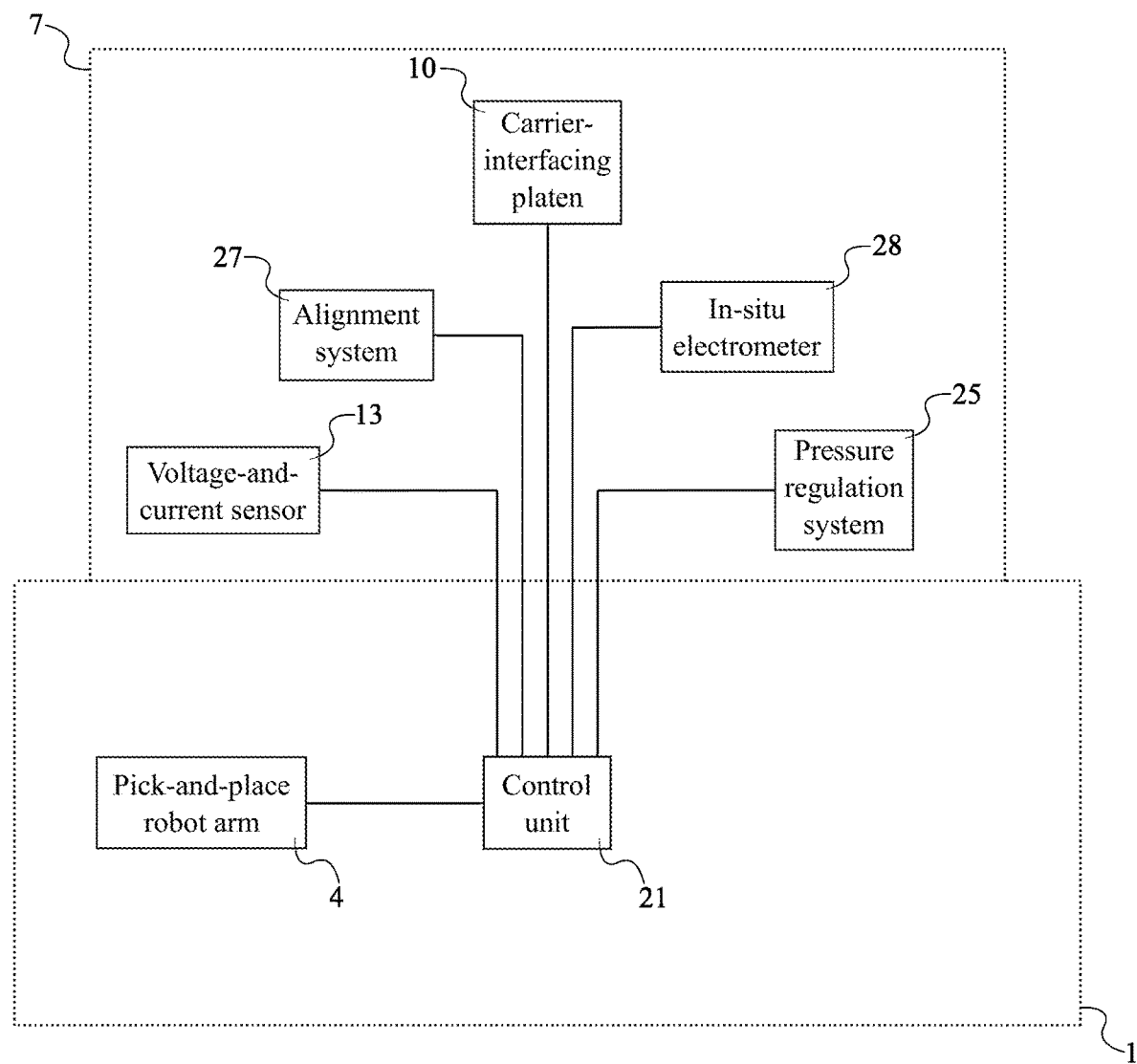
FIG. 7 is a block diagram illustrating the electronic components of the present invention.

A single wafer is either electrostatically mated or separated from a single carrier within the bonding/de-bonding station 7, which may comprise an interior chamber 9, a carrier-interfacing platen 10, a high-voltage electrostatic generator 11, and a ground 12, which are shown in FIGS. 5 and 7. The interior chamber 9 is used to confine a single wafer onto a single carrier during the mating process and is used to confine a single assembly during the separation process. The entrance 8 of the bonding/de-bonding station 7 traverses into the interior chamber 9, which allows the pick-and-place robot arm 4 to access the interior chamber 9. The carrier-interfacing platen 10 can be used to electrostatically charge a single carrier so that a single wafer adheres to the single carrier during the mating process. The carrier-interfacing platen 10 can also be used to electrostatically discharge a single carrier so that a single wafer is released from the single carrier during the separation process. The carrier-interfacing platen 10 is mounted within the interior chamber 9, which allows the pick-and-place robot arm 4 to easily place a single carrier or a single assembly onto the carrier-interfacing platen 10.

Moreover, the high-voltage electrostatic generator 11 is used to provide the necessary electrostatic charge to adhere a single wafer to a single carrier during the mating process. Thus, the high-voltage electrostatic generator 11 needs to be electrically connected to the carrier-interfacing platen 10 so that the high-voltage electrostatic generator 11 can transfer the necessary electrostatic charge to the carrier-interfacing platen 10. The ground 12 is alternatively used to shunt the residing electrostatic charge away from a single carrier in order to release a single wafer from the single carrier during the separation process. Thus, the ground 12 needs to be electrically connected to the carrier-interfacing platen 10 so that the ground 12 can receive the residing electrostatic charge from the carrier-interfacing platen 10. Furthermore, the carrier-interfacing platen 10 is electronically connected to the control unit 21 so that the control unit 21 is readily able to activate the carrier-interfacing platen 10 and electrostatically charge or discharge a single carrier.

As can be seen in FIGS. 5 and 7, the bonding/de-bonding station 7 may further comprise a voltage-and-current sensor 13, which is used to take the voltage and current readings from the electrical connection between the high-voltage electrostatic generator 11 and the carrier-interfacing platen 10 during the mating process. Thus, the voltage-and-current sensor 13 needs to be electrically connected in between the high-voltage electrostatic generator 11 and the carrier-interfacing platen 10. In addition, the voltage-and-current sensor 13 is electronically connected to the control unit 21 so that the control unit 21 is able to deductively determine the capacitance of a single carrier from the voltage and current readings. The capacitance of the single carrier placed on the carrier-interfacing platen 10 can be used to measures the strength of the electrostatic bond between a single wafer and the single carrier.

As can be seen in FIG. 6, the present invention may further comprise a pressure regulation system 25 and a hatch 26, which are used to apply or release an additional vacuum seal between a single wafer and a single carrier. The hatch 26 is used to hermetically seal the entrance 8 of the bonding/de-bonding station 7, which creates a closed system for the quantity of air retained within the interior chamber 9. The pressure regulation system 25 is in fluid communication with interior chamber 9 of the bonding/de-bonding station 7. This allows the pressure regulation system 25 to vacuum out the quantity of air within the interior chamber 9 in order to create the additional vacuum seal between a single wafer and a single carrier during the mating process. This alternatively allows the pressure regulation system 25 to pump air into the interior chamber 9 in order to release an existing vacuum seal between a single wafer and a single carrier. The pressure regulation system 25 is preferably a pneumatic pump that is configured to increase or decrease the air pressure within the interior chamber 9. The pressure regulation system 25 is also electronically connected to the control unit 21 so that the control unit 21 is readily able to vacuum or pump air into the interior chamber 9 with the pressure regulation system 25.

As can be seen in FIGS. 5 and 7, the present invention may further comprise an alignment system 27, which is used to proper align a single wafer onto a single carrier as a way to ensure a secure electrostatic bond between the single wafer and the single carrier. For example, if the single wafer is placed onto the single carrier, and if the single wafer is overhanging past the boundary of the single carrier, then the alignment system 27 moves the single wafer within the boundary of the single carrier, which allows the single carrier to make physical contact with the entire wafer and ensures a secure electrostatic bond between the single wafer and the single carrier. Thus, the alignment system 27 is integrated into the interior chamber 9, which allows the alignment system 27 to adjust the positioning of the single wafer on the single carrier after the single wafer is initially placed onto the single carrier. The alignment system 27 is preferably a set of mechanical arms that can adjust the positioning of a single wafer in any direction within the interior chamber 9. In addition, the alignment system 27 is preferably uses a computer-vision system and/or optical sensor to detect whether or not a single wafer is misaligned on a single carrier. The alignment system 27 is electronically connected to the control unit 21 so that the control unit 21 is readily be able to activate the alignment system 27, once the present invention detects that the single wafer is not properly situated upon the single carrier.

As can be seen in FIGS. 5 and 7, the present invention may further comprise an in-situ electrometer 28, which is used to measure the residual electrostatic field between a single wafer and a single carrier in order to determine if the strength of the electrostatic bond in between the signal wafer and the single carrier is a sufficiently-adhesive bond. The in-situ electrometer 28 is integrated into the interior chamber 9 so that the in-situ electrometer 28 is physically near enough to sense the residual electrostatic field between the single wafer and the single carrier. The in-situ electrometer 28 is electronically connected to the control unit 21 so that the in-situ electrometer 28 is readily able to communicate the measurement data to the control unit 21, which processes the measurement data and determines the strength of the electrostatic bond between the single wafer and the single carrier.

Although the invention has been explained in relation to its preferred embodiment, it is to be understood that many other possible modifications and variations can be made without departing from the spirit and scope of the invention as hereinafter claimed.

What is claimed is:

1. An automated electrostatic bonding/de-bonding apparatus comprises:
   a transfer enclosure;
   a pick-and-place robot arm;
   a bonding/de-bonding station;
   a plurality of input/output (I/O) ports;
   a plurality of I/O cassettes;
   a control unit;
   each of the plurality of I/O ports being integrated into the transfer enclosure;
   an entrance of the bonding/de-bonding station traversing into the transfer enclosure;
   the plurality of I/O ports and the bonding/de-bonding station being distributed about the transfer enclosure;
   each of the plurality of I/O cassettes being engaged into a selected port from the plurality of I/O ports;
   the pick-and-place robot arm being operatively mounted within the transfer enclosure, wherein the pick-and-place robot arm is used to transport items amongst the plurality of I/O cassettes and the bonding/de-bonding station; and
   the pick-and-place robot arm and the bonding/de-bonding station being electronically connected to the control unit.

2. The automated electrostatic bonding/de-bonding apparatus as claimed in claim 1 comprises:
   a stack of semiconductive wafers;
   the plurality of I/O cassettes comprises a first I/O cassette;
   the stack of semiconductive wafers being housed with the first I/O cassette;
   the pick-and-place robot arm being configured to grasp a single wafer from the stack of semiconductive wafers out of the first I/O cassette; and
   the pick-and-place robot arm being configured to insert a single wafer into the stack of semiconductive wafers within the first I/O cassette.

3. The automated electrostatic bonding/de-bonding apparatus as claimed in claim 1 comprises:
   a stack of mobile electrostatic carriers;
   the plurality of I/O cassettes comprises a second I/O cassette;
   the stack of mobile electrostatic carriers being housed with the second I/O cassette;
   the pick-and-place robot arm being configured to grasp a single carrier from the stack of mobile electrostatic carriers out of the second I/O cassette; and
   the pick-and-place robot arm being configured to insert a single carrier into the stack of mobile electrostatic carriers within the second I/O cassette.

4. The automated electrostatic bonding/de-bonding apparatus as claimed in claim 1 comprises:
   a stack of bonded wafer-carrier assemblies;
   the plurality of I/O cassettes comprises a third I/O cassette;
   the stack of bonded wafer-carrier assemblies being housed with the third I/O cassette;
   the pick-and-place robot arm being configured to grasp a single assembly from the stack of bonded wafer-carrier assemblies out of the third I/O cassette; and
   the pick-and-place robot arm being configured to insert a single assembly into the stack of bonded wafer-carrier assemblies within the third I/O cassette.

5. The automated electrostatic bonding/de-bonding apparatus as claimed in claim 1 comprises:
   the transfer enclosure comprises a first face and a second face;
   the first face and the second face being positioned parallel to each other;
   the first face and the second face being positioned opposite to each other about the transfer enclosure;
   each of the plurality of I/O ports being integrated into the first face; and
   the entrance of the bonding/de-bonding station traversing into the second face.

6. The automated electrostatic bonding/de-bonding apparatus as claimed in claim 1 comprises:
   each of the plurality of I/O ports comprises an access hole and a lock-and-release mechanism;
   the access hole traversing into the transfer enclosure; and
   the lock-and-release mechanism being externally mounted to the transfer enclosure, adjacent to the access hole.

7. The automated electrostatic bonding/de-bonding apparatus as claimed in claim 6 comprises:
   each of the plurality of I/O cassettes being detachably attached to the selected port by the lock-and-release mechanism.

8. The automated electrostatic bonding/de-bonding apparatus as claimed in claim 1 comprises:
   the pick-and-place robot arm comprises a grasping end and a fixed end;
   the fixed end being pivotably connected within the transfer enclosure, offset from the plurality of I/O ports and the entrance of the bonding/de-bonding station; and
   the grasping end being positioned adjacent to the plurality of I/O ports and the entrance of the bonding/de-bonding station.

9. The automated electrostatic bonding/de-bonding apparatus as claimed in claim 1 comprises:
   the bonding/de-bonding station comprises an interior chamber, a carrier-interfacing platen, a high-voltage electrostatic generator, and a ground;
   the entrance of the bonding/de-bonding station traversing into the interior chamber;
   the carrier-interfacing platen being mounted within the interior chamber;
   the carrier-interfacing platen being electrically connected to the high-voltage electrostatic generator;

the carrier-interfacing platen being electrically connected to the ground; and the carrier-interfacing platen being electronically connected to the control unit.

10. The automated electrostatic bonding/de-bonding apparatus as claimed in claim 1 comprises:

the bonding/de-bonding station further comprises a voltage-and-current sensor;

the voltage-and-current sensor being electrically connected in between the carrier-interfacing platen and the high-voltage electrostatic generator; and the voltage-and-current sensor being electronically connected to the control unit.

11. The automated electrostatic bonding/de-bonding apparatus as claimed in claim 1 comprises:

a pressure regulation system;

a hatch;

the bonding/de-bonding station comprises an interior chamber;

the entrance of the bonding/de-bonding station traversing into the interior chamber;

the entrance of the bonding/de-bonding station being hermetically sealed by the hatch;

the pressure regulation system being in fluid communication with the interior chamber of the bonding/de-bonding station; and the pressure regulation system being electronically connected to the control unit.

12. The automated electrostatic bonding/de-bonding apparatus as claimed in claim 1 comprises:

an alignment system;

the bonding/de-bonding station comprises an interior chamber;

the entrance of the bonding/de-bonding station traversing into the interior chamber;

the alignment system being integrated into the interior chamber; and the alignment system being electronically connected to the control unit.

13. The automated electrostatic bonding/de-bonding apparatus as claimed in claim 1 comprises:

an in-situ electrometer;

the bonding/de-bonding station comprises an interior chamber;

the entrance of the bonding/de-bonding station traversing into the interior chamber;

the in-situ electrometer being integrated into the interior chamber; and the in-situ electrometer being electronically connected to the control unit.

14. An automated electrostatic bonding/de-bonding apparatus comprises:

a transfer enclosure;

a pick-and-place robot arm;

a bonding/de-bonding station;

a plurality of input/output (I/O) ports;

a plurality of I/O cassettes;

a control unit;

a pressure regulation system;

a hatch;

the bonding/de-bonding station comprises an interior chamber;

each of the plurality of I/O ports being integrated into the transfer enclosure;

an entrance of the bonding/de-bonding station traversing into the transfer enclosure;

the plurality of I/O ports and the bonding/de-bonding station being distributed about the transfer enclosure;

each of the plurality of I/O cassettes being engaged into a selected port from the plurality of I/O ports;

the pick-and-place robot arm being operatively mounted within the transfer enclosure, wherein the pick-and-place robot arm is used to transport items amongst the plurality of I/O cassettes and the bonding/de-bonding station;

the pick-and-place robot arm and the bonding/de-bonding station being electronically connected to the control unit;

the entrance of the bonding/de-bonding station traversing into the interior chamber;

the entrance of the bonding/de-bonding station being hermetically sealed by the hatch;

the pressure regulation system being in fluid communication with the interior chamber of the bonding/de-bonding station; and the pressure regulation system being electronically connected to the control unit.

15. The automated electrostatic bonding/de-bonding apparatus as claimed in claim 14 comprises:

a stack of semiconductive wafers;

a stack of mobile electrostatic carriers;

a stack of bonded wafer-carrier assemblies;

the plurality of I/O cassettes comprises a first I/O cassette, a second I/O cassette, and a third I/O cassette;

the stack of semiconductive wafers being housed with the first I/O cassette;

the pick-and-place robot arm being configured to grasp a single wafer from the stack of semiconductive wafers out of the first I/O cassette;

the pick-and-place robot arm being configured to insert a single wafer into the stack of semiconductive wafers within the first I/O cassette;

the stack of mobile electrostatic carriers being housed with the second I/O cassette;

the pick-and-place robot arm being configured to grasp a single carrier from the stack of mobile electrostatic carriers out of the second I/O cassette;

the pick-and-place robot arm being configured to insert a single carrier into the stack of mobile electrostatic carriers within the second I/O cassette;

the stack of bonded wafer-carrier assemblies being housed with the third I/O cassette;

the pick-and-place robot arm being configured to grasp a single assembly from the stack of bonded wafer-carrier assemblies out of the third I/O cassette; and the pick-and-place robot arm being configured to insert a single assembly into the stack of bonded wafer-carrier assemblies within the third I/O cassette.

16. The automated electrostatic bonding/de-bonding apparatus as claimed in claim 14 comprises:

the transfer enclosure comprises a first face and a second face;

the pick-and-place robot arm comprises a grasping end and a fixed end;

the first face and the second face being positioned parallel to each other;

the first face and the second face being positioned opposite to each other about the transfer enclosure;

each of the plurality of I/O ports being integrated into the first face;

the entrance of the bonding/de-bonding station traversing into the second face;

the fixed end being pivotably connected within the transfer enclosure, offset from the plurality of I/O ports and the entrance of the bonding/de-bonding station; and the grasping end being positioned adjacent to the plurality of I/O ports and the entrance of the bonding/de-bonding station.

17. The automated electrostatic bonding/de-bonding apparatus as claimed in claim 14 comprises:

each of the plurality of I/O ports comprises an access hole and a lock-and-release mechanism;

the access hole traversing into the transfer enclosure;

the lock-and-release mechanism being externally mounted to the transfer enclosure, adjacent to the access hole; and each of the plurality of I/O cassettes being detachably attached to the selected port by the lock-and-release mechanism.

18. The automated electrostatic bonding/de-bonding apparatus as claimed in claim 14 comprises:

the bonding/de-bonding station comprises an interior chamber, a carrier-interfacing platen, a high-voltage electrostatic generator, a ground, and a voltage-and-current sensor;

the entrance of the bonding/de-bonding station traversing into the interior chamber;

the carrier-interfacing platen being mounted within the interior chamber;

the carrier-interfacing platen being electrically connected to the high-voltage electrostatic generator;

the carrier-interfacing platen being electrically connected to the ground;

the carrier-interfacing platen being electronically connected to the control unit;

the voltage-and-current sensor being electrically connected in between the carrier-interfacing platen and the high-voltage electrostatic generator; and the voltage-and-current sensor being electronically connected to the control unit.

19. The automated electrostatic bonding/de-bonding apparatus as claimed in claim 14 comprises:

an alignment system;

the bonding/de-bonding station comprises an interior chamber;

the entrance of the bonding/de-bonding station traversing into the interior chamber;

the alignment system being integrated into the interior chamber; and the alignment system being electronically connected to the control unit.

20. The automated electrostatic bonding/de-bonding apparatus as claimed in claim 14 comprises:

an in-situ electrometer;

the bonding/de-bonding station comprises an interior chamber;

the entrance of the bonding/de-bonding station traversing into the interior chamber;

the in-situ electrometer being integrated into the interior chamber; and the in-situ electrometer being electronically connected to the control unit.

\* \* \* \* \*